(12) United States Patent
Tieman

(10) Patent No.: US 11,905,150 B1
(45) Date of Patent: Feb. 20, 2024

(54) INSTALLATION TOOL FOR A DISPLAY AND METHOD OF USE

(71) Applicant: Michael Anthony Tieman, Las Vegas, NV (US)

(72) Inventor: Michael Anthony Tieman, Las Vegas, NV (US)

( * ) Notice: Subject to any disclaimer, the term of this patent is extended or adjusted under 35 U.S.C. 154(b) by 212 days.

(21) Appl. No.: 17/348,951

(22) Filed: Jun. 16, 2021

(51) Int. Cl.
  *B66F 3/08* (2006.01)
  *F16M 13/02* (2006.01)
  *H05K 5/02* (2006.01)

(52) U.S. Cl.
  CPC ............... *B66F 3/08* (2013.01); *F16M 13/02* (2013.01); *H05K 5/0204* (2013.01)

(58) Field of Classification Search
  USPC ........................................... 248/125.2, 188.4
  See application file for complete search history.

(56) References Cited

U.S. PATENT DOCUMENTS 7,044,423 B2 * 5/2006 Bober ..................... F16M 11/18
  248/188.4
9,834,421 B2 * 12/2017 Raper, Jr. .................. B66F 5/02
2007/0240347 A1 * 10/2007 Chang ................. G09F 15/0087
  248/329

OTHER PUBLICATIONS

E-Z TV Lift. Product Page and Testimonials [online]. E-Z Spread n' Lift Industries, 2021 [archived May 17, 2021]. Retrieved from the Internet: Aug. 31, 2023 <URLs: https://web.archive.org/web/20210517163202/https://e-zspreadnlift.com/tvtest.htm and */detailtvf.htm (Year: 2021).*

* cited by examiner

*Primary Examiner* — Don M Anderson
*Assistant Examiner* — Jonathan R Zaworski
(74) *Attorney, Agent, or Firm* — Ted Masters

(57) ABSTRACT

An installation tool is provided for a display. The display is connectable to a wall mount which is connected to a wall. The installation tool includes a support which is configured to receive the bottom edge of the display. A hanger is configured to connect to the wall mount. A threaded rod connects the support and the hanger. A threaded receptacle receives the threaded rod. The installation tool is first connected to the wall mount. The display is placed on the support, and is raised using the threaded rod, so that the display can be connected to the wall mount.

5 Claims, 10 Drawing Sheets

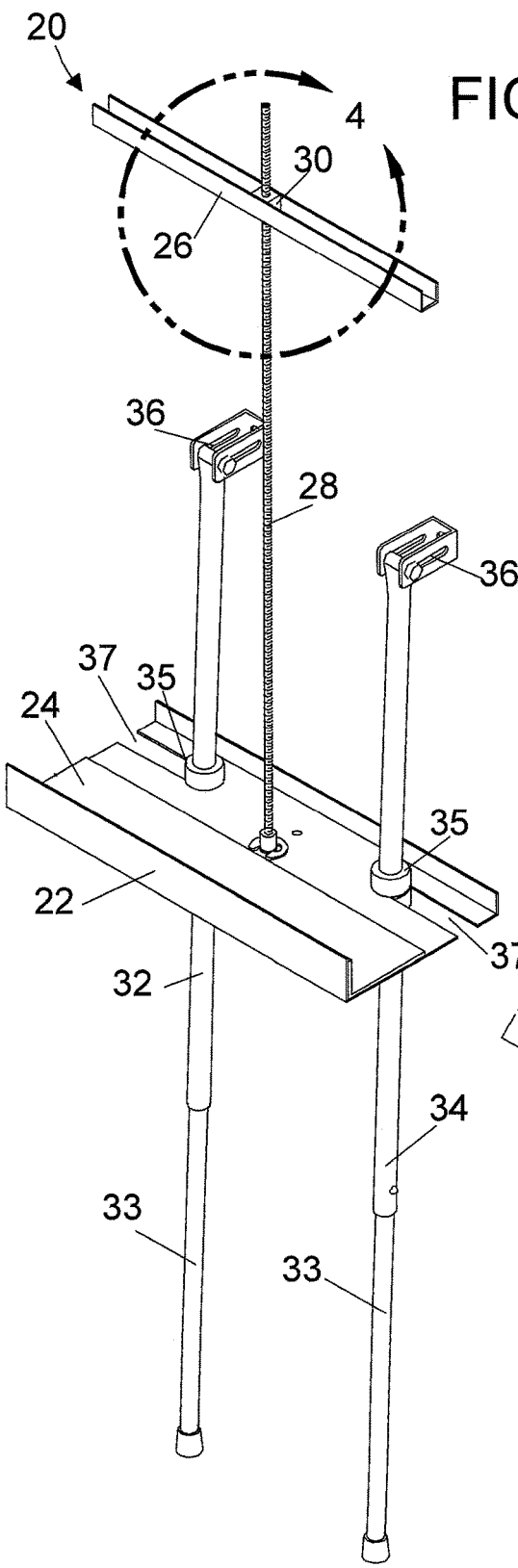
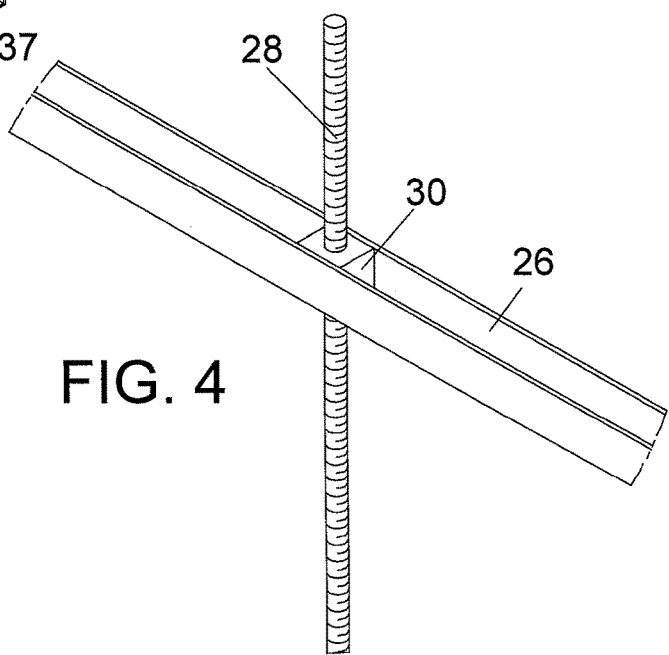

FIG. 12
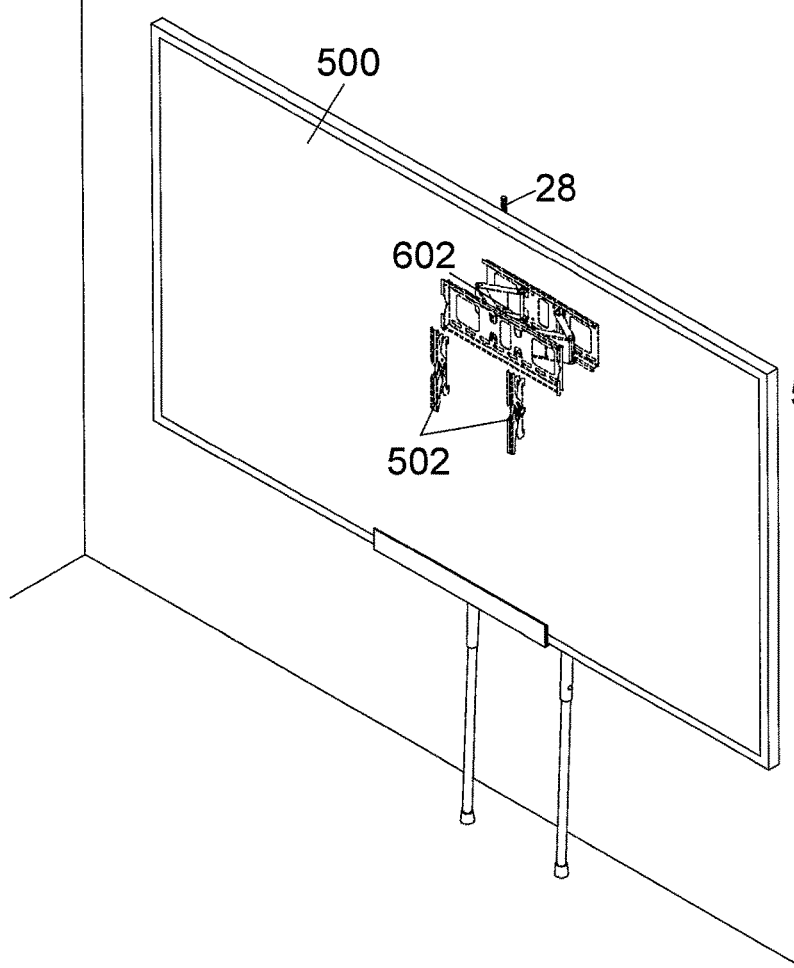
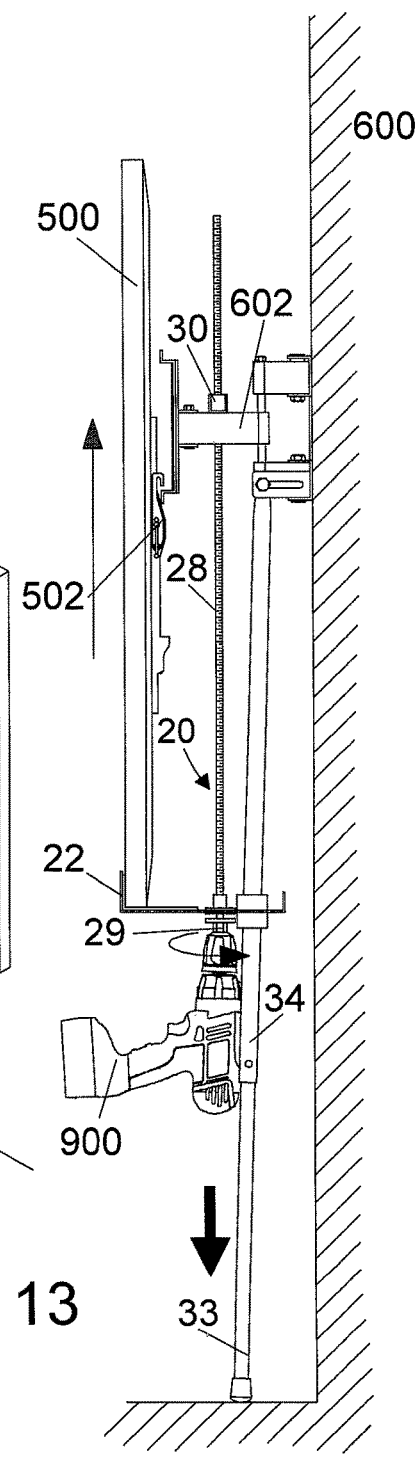
FIG. 13

FIG. 14
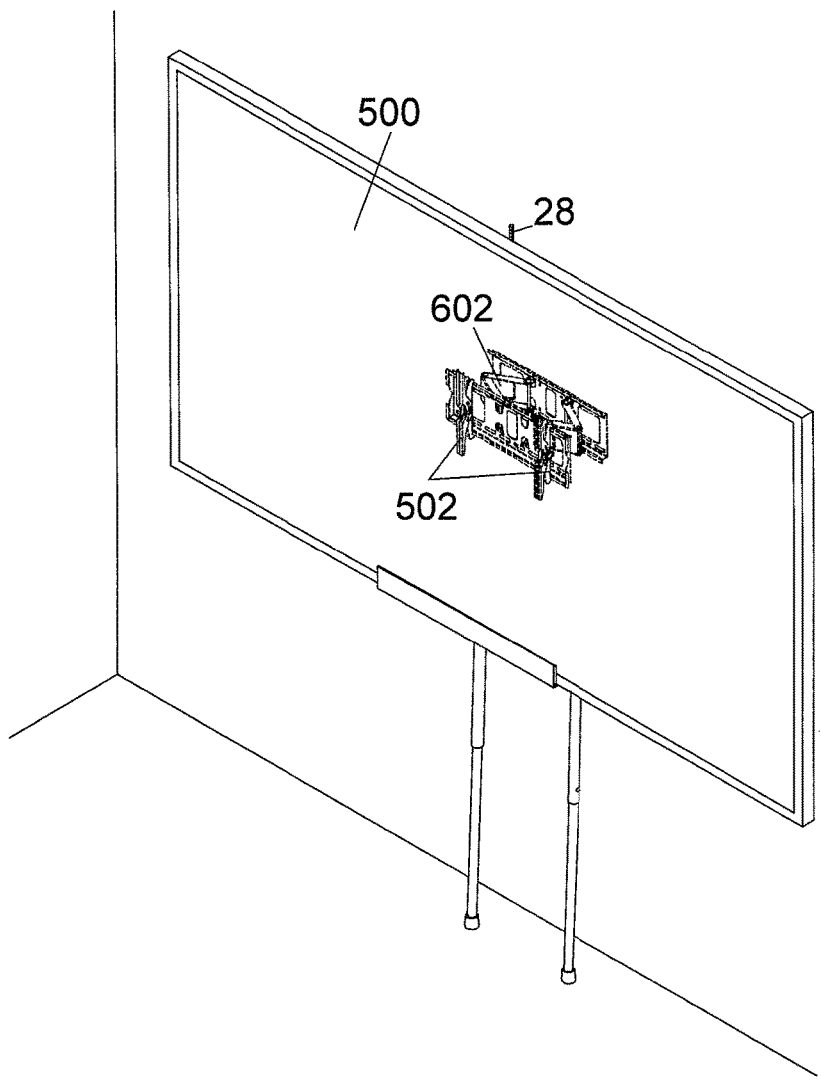
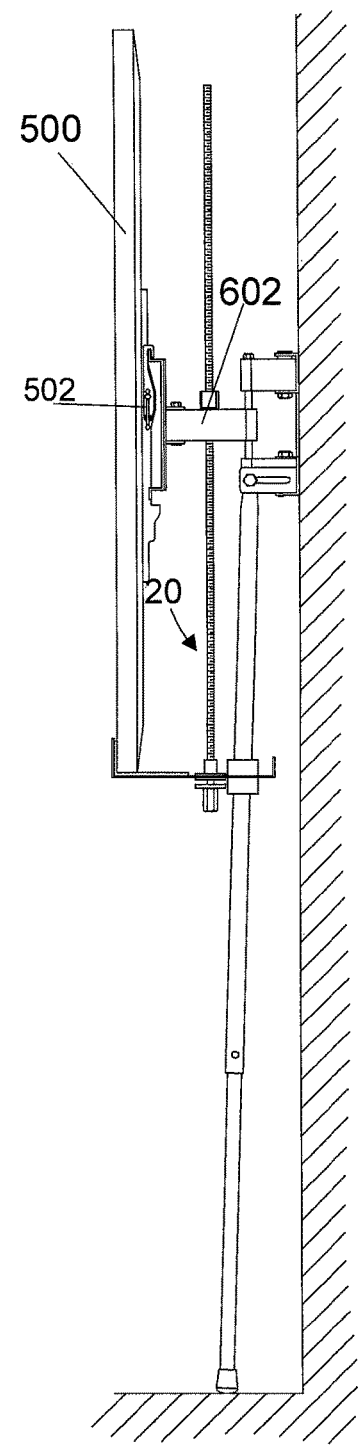
FIG. 15

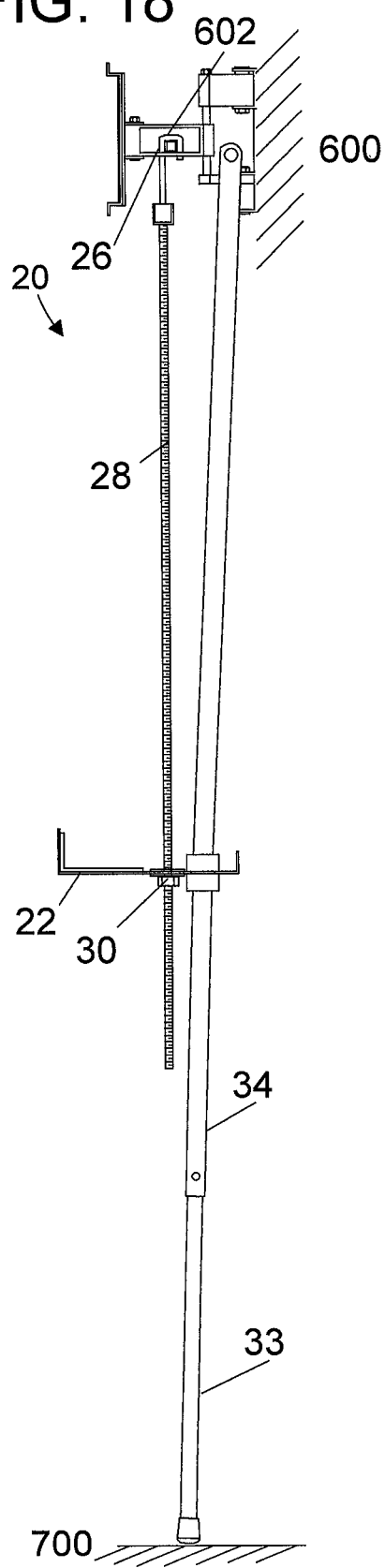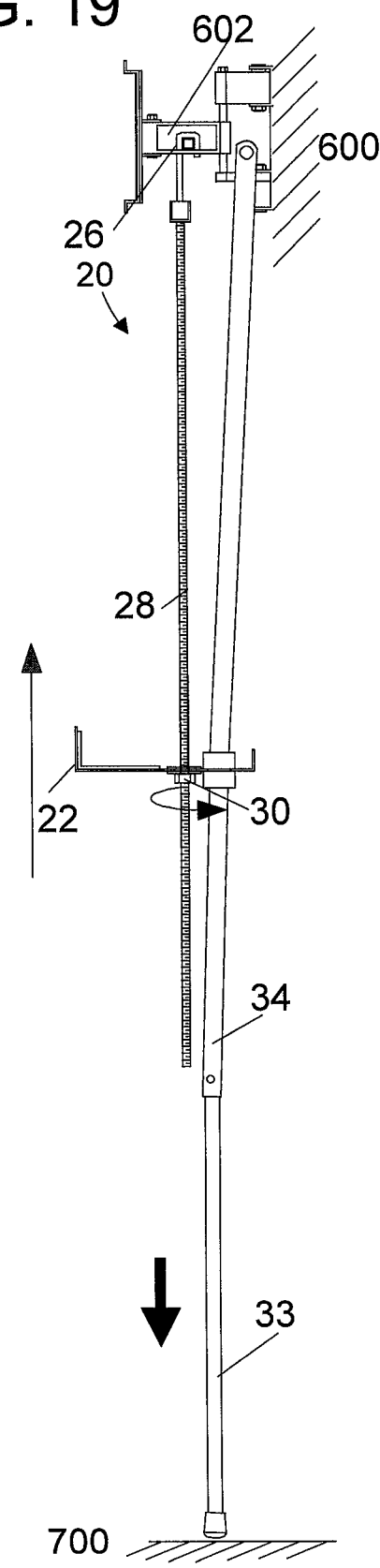

FIG. 20
FIG. 21
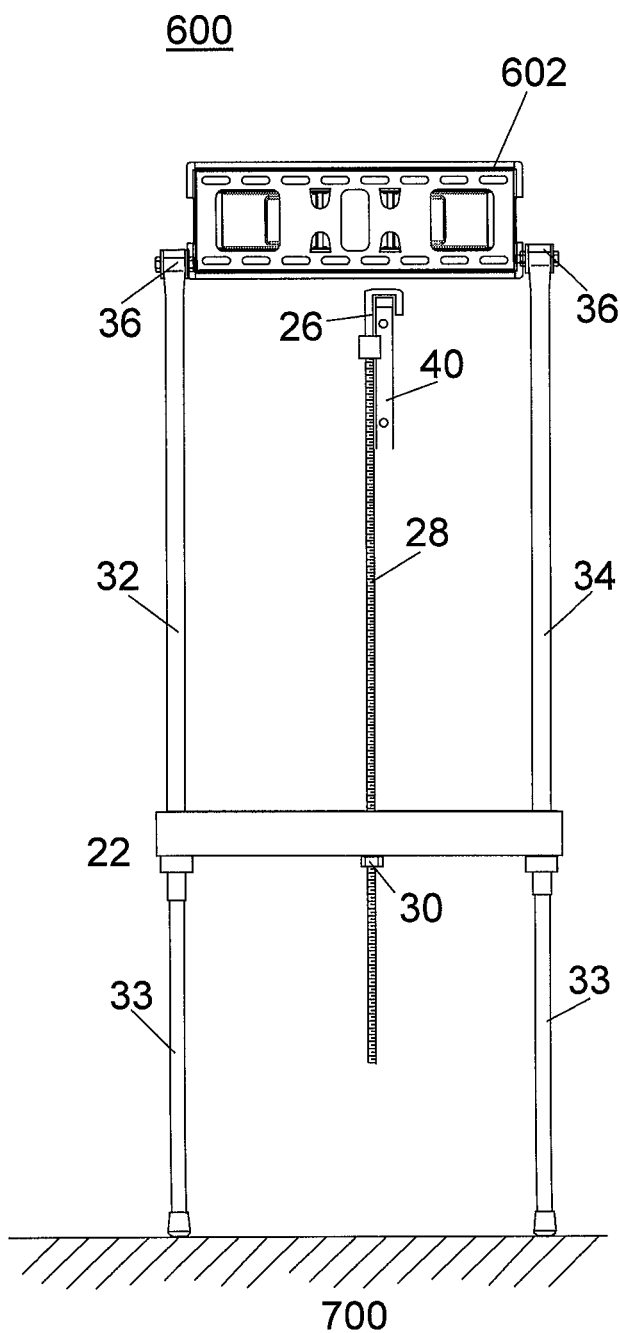
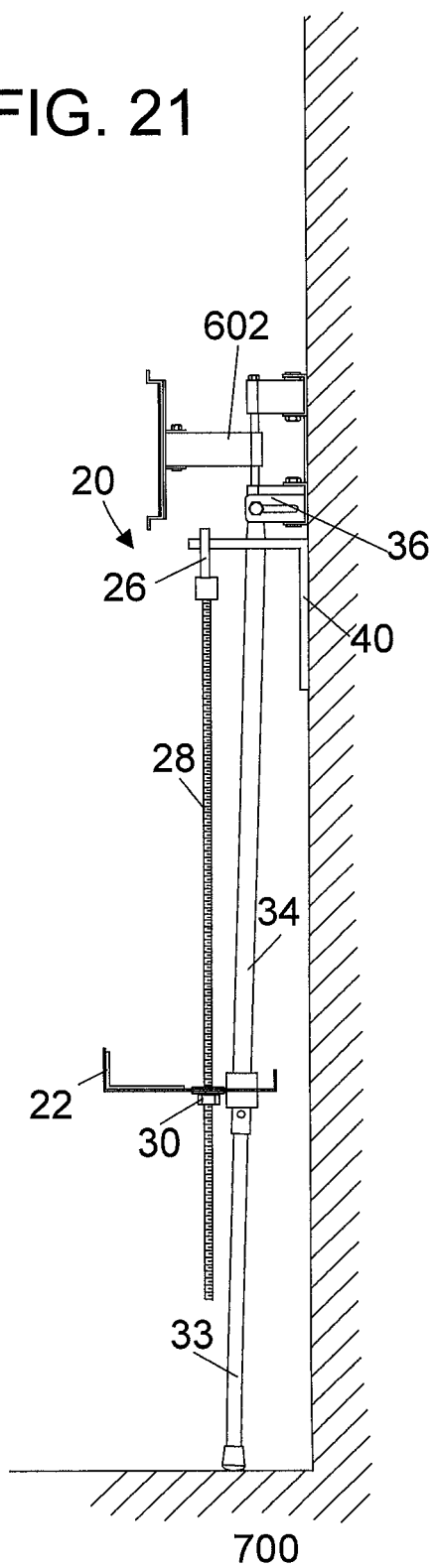

INSTALLATION TOOL FOR A DISPLAY AND METHOD OF USE

CROSS REFERENCE TO RELATED APPLICATION

None.

TECHNICAL FIELD

The present invention pertains generally to wall-mounted displays, and more particularly to an installation tool for facilitating the connection of the display to a wall mount.

BACKGROUND OF THE INVENTION

Wall-mounted displays are well know in the art. These displays are generally flat and are connected to a wall mount positioned on a wall. The display must be lifted up to align with the wall mount, and then must be connected to the wall mount. Because of the weight and bulk of the display, this process presents a problem for a single person to implement.

BRIEF SUMMARY OF THE INVENTION

The present invention is directed to an installation tool for a display which facilitates the wall-mounted installation process, and makes it possible for a single person to effect the installation. The installation tool is connected to the wall mount. The display is then loaded into the installation tool. The display is then raised so that it's wall-facing connectors align with the wall mount, and it can be connected thereto. The raising is accomplished by rotating a threaded rod or a threaded receptacle. The rotation can be accomplished with a power tool such as a drill motor, or other rotational device. By using the installation tool, a single person can safely and easily connect the display to the wall mount in a short period of time.

In accordance with an embodiment an installation tool for a display is provided. The display has a bottom edge, and is connectable to a wall mount which is connected to a wall. The installation tool includes a support which is configured to receive the bottom edge of the display. A hanger is configured to connect to the wall mount. A threaded rod connects the support and to the hanger. A threaded receptacle receives the threaded rod.

In accordance with another embodiment, the display has a weight. The installation tool has an in-use configuration in which the hanger is connected to the wall mount, and the display rests in the support. In the in the in-use configuration the weight of the display is borne by the wall mount via the hanger, the threaded rod, the threaded receptacle, and the support.

In accordance with another embodiment, the threaded receptacle is connected to the hanger, and the threaded rod is rotatable.

In accordance with another embodiment, the threaded rod is connected to the hanger, and the threaded receptacle is disposed below the support and is rotatable.

In accordance with another embodiment, the support includes a pad which is configured to cushion the bottom edge of the display.

In accordance with another embodiment, a first variable length guide downwardly extends from the support, and a second variable length guide downwardly extends from the support.

Other embodiments, in addition to the embodiments enumerated above, will become apparent from the following detailed description, taken in conjunction with the accompanying drawings, which illustrate, by way of example, the principles of the installation tool for a display and method of use.

BRIEF DESCRIPTION OF THE DRAWINGS

FIG. 3 is an enlarged perspective view of the installation tool;

FIG. 4 is an enlarged view of area 4 of FIG. 3;

FIG. 12 is a perspective view of the display being moved upward by the installation tool;

FIG. 13 is an enlarged side elevation view of FIG. 12;

FIG. 14 is a perspective view of the display moved further upward;

FIG. 15 is an enlarged side elevation view of FIG. 14;

FIG. 18 is an enlarged side elevation view of a second embodiment of the installation tool;

FIG. 19 is an enlarged side elevation view with the support raised;

FIG. 20 is an enlarged front elevation view of a third embodiment of the installation tool; and, FIG. 21 is an enlarged side elevation of the third embodiment.

DETAILED DESCRIPTION OF THE INVENTION

Figure 1:
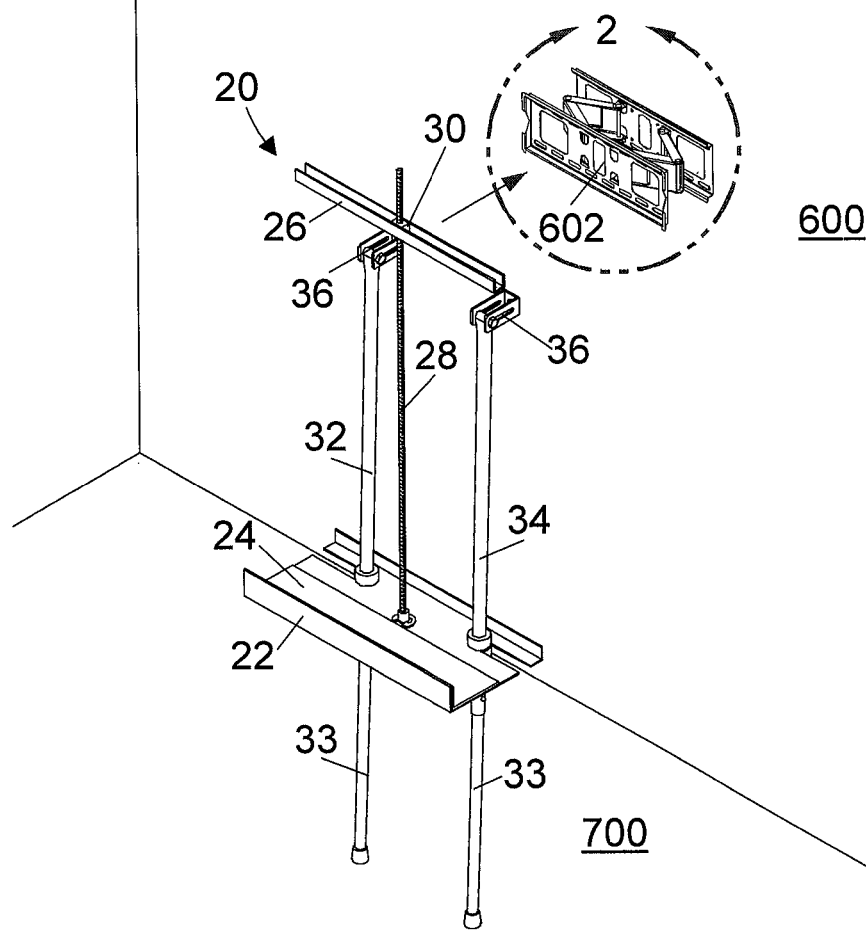
FIG. 1 is a perspective view of an installation tool for a wall-mounted display ready to be connected to a wall mount.
Figure 2:
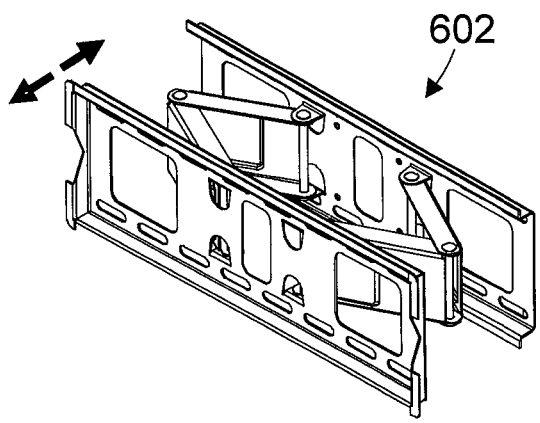
FIG. 2 is an enlarged view of area 2 of FIG. 1.
Figure 5:
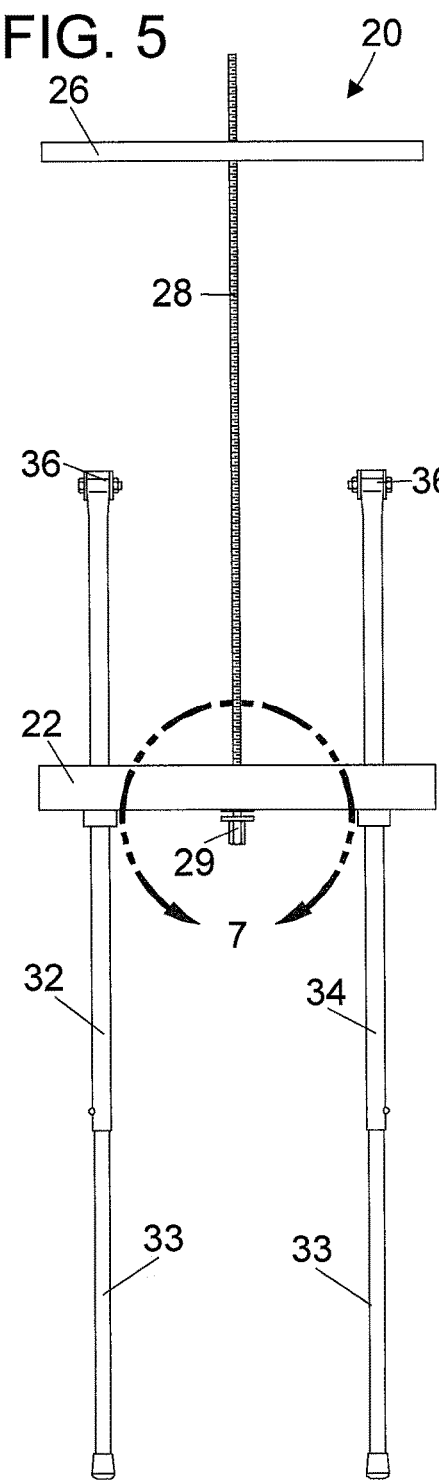
FIG. 5 is an enlarged front elevation view of the installation tool.
Figure 6:
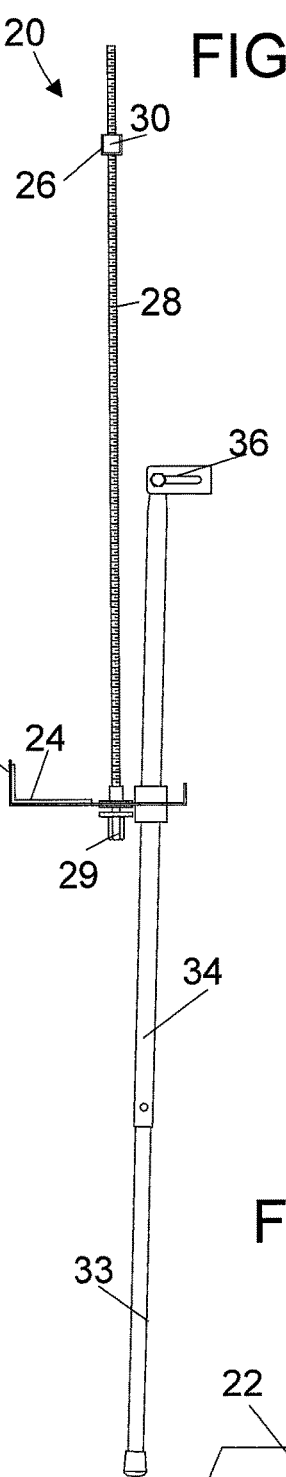
FIG. 6 is an enlarged side elevation view of the installation tool.
Figure 7:
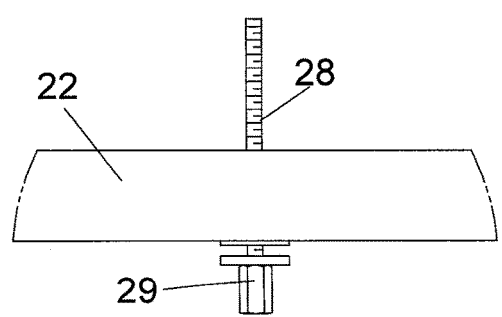
FIG. 7 is an enlarged view of area 7 of FIG. 5.

Referring initially to FIGS. 1-7 there are illustrated several views of an installation tool for a wall-mounted display, the installation tool generally designated as 20. Installation tool 20 is used to facilitate the connection of a display 500 (refer to FIG. 10-11) to a wall mount 602, the wall mount being 602 connected to a wall 600 which upwardly projects from a support surface 700 (such as a floor). In the shown embodiment wall mount 602 is articulated so that it can move away from and toward wall 600 (refer to arrows in FIG. 2). However it may be appreciated that different types of wall mounts 602 could also be utilized. Display 500 embraces any electronic visual display which can be mounted on a wall, and which electronically receives and presents images. Flat screen LCD and LED displays are commonplace in today's technology, however other technology displays can also profit from the present installation tool 20. Moreover, display 500 can be an integrated unit which contains all TV and display-associated electronics, or just a monitor which cooperates with a remote electronic unit.

Figure 9:
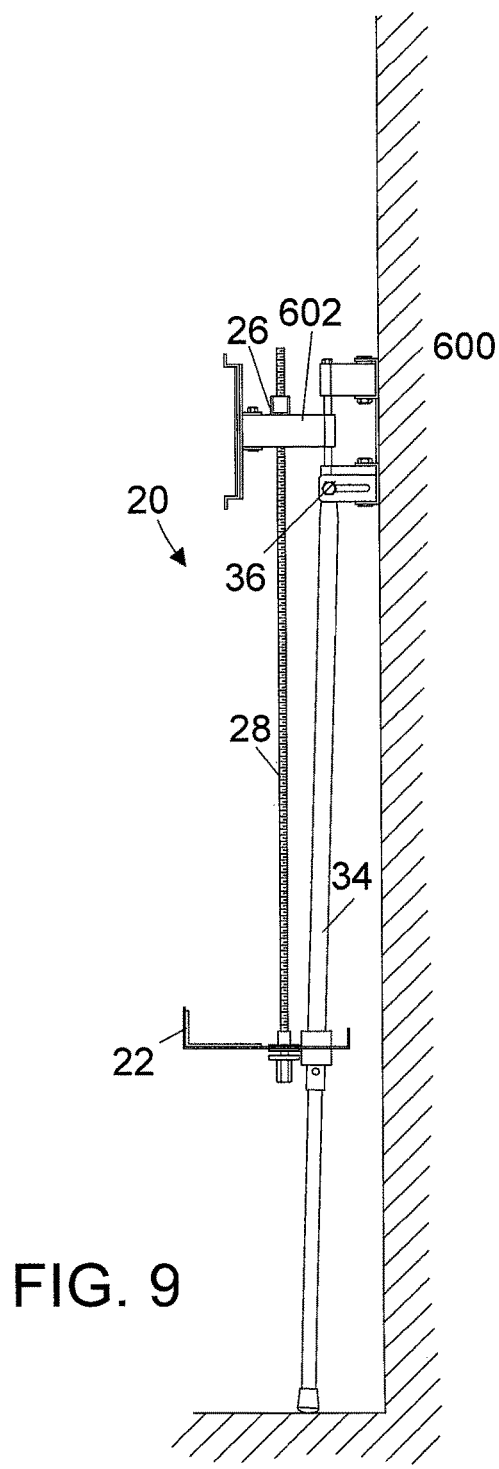
FIG. 9 is an enlarged side elevation view of FIG. 8.
Figure 10:
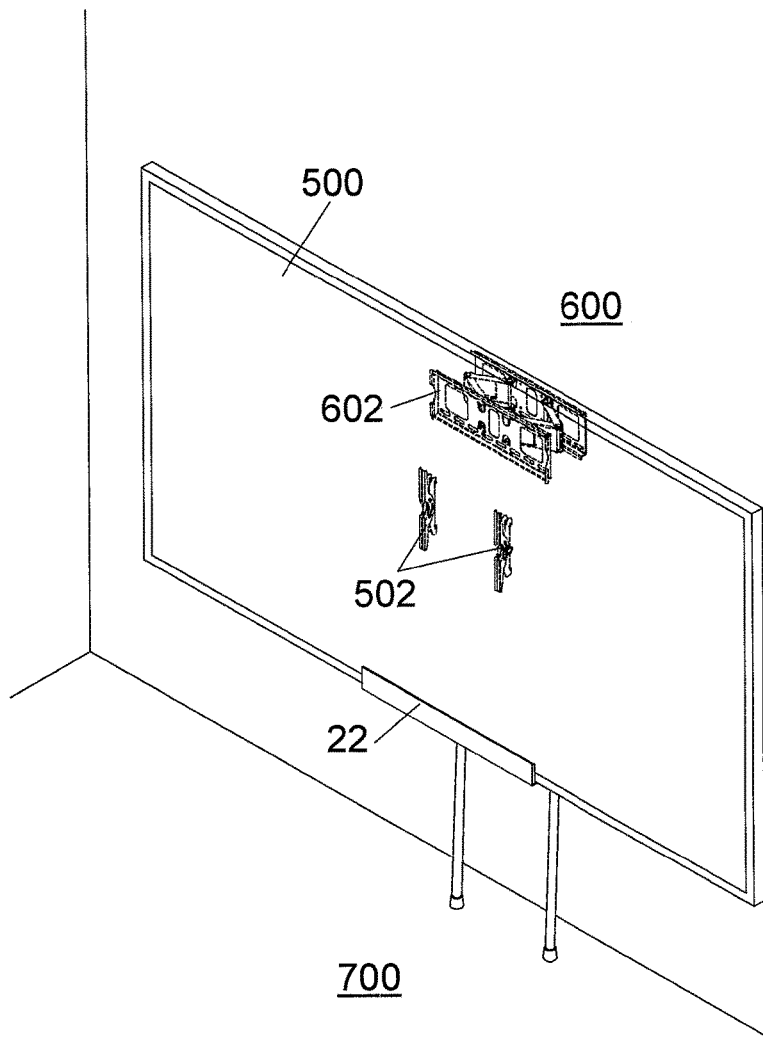
FIG. 10 is a perspective view of a display resting in the installation tool.
Figure 11:
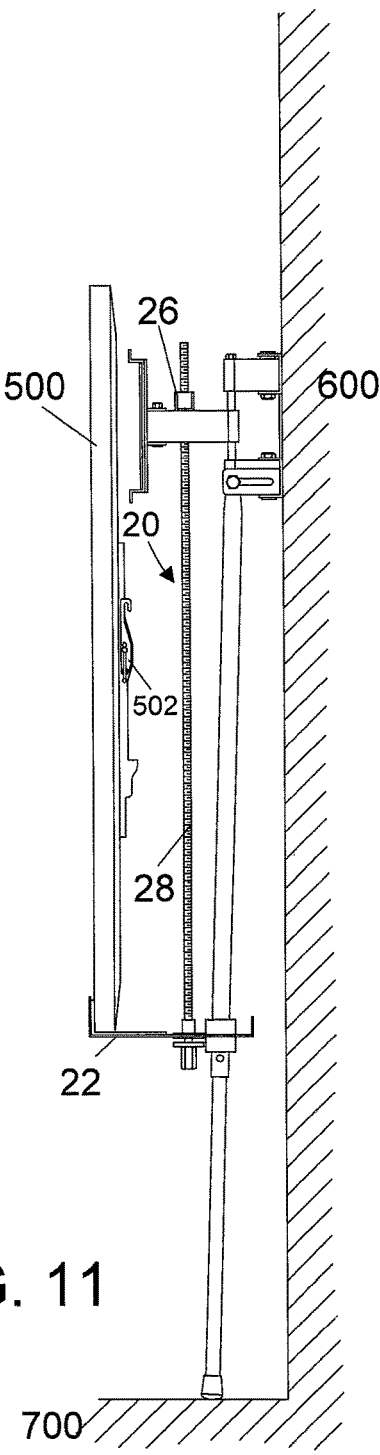
FIG. 11 is an enlarged side elevation view of FIG. 10.

Installation tool 20 includes a support 22 which is configured to receive the bottom edge 501 of display 500 (refer to FIGS. 10 and 11). In the shown embodiment support 22 includes a channel which serves as a cradle to removably receive bottom edge 501 of display 500. However it may be appreciated that support 22 could have other designs and shapes, so long as it receives the display 500. Also in the shown embodiment, support 22 includes a pad 24 which acts as a cushion and prevent marring of display 500. Installation tool 20 further includes a hanger 26 which is configured to connect to wall mount 602. In the shown embodiment hanger 26 is a channel which rests upon wall mount 602 (refer to FIGS. 8 and 9) and is supported thereby. It may be appreciated however that hanger 26 can include any design which allows it to be connected to wall mount 602. FIGS. 18 and 19 show a hanger 26 which is hook-shaped and engages a member of wall mount 602. Other hangers 26 could be connected to wall mount 602 with threads, pins, wire or other line, be threaded, be pinned. be tied to, be clamped, be clipped, or by any other method which provides a secure removable connection to wall mount 602.

Installation tool 20 further includes a threaded rod 28 which connects support 22 and hanger 26, and a threaded receptacle 30 which receives threaded rod 28. Threaded rod 28 includes a rotational head 29 which is shaped and dimensioned to be received by a rotational tool 900 such as a drill motor, wrench, or screwdriver (refer to FIGS. 5-7, and 13). In the shown embodiment, threaded receptacle 30 is a nut which is captively connected to hanger 26 so that it cannot rotate independent of hanger 26. It may be appreciated that threaded receptacle 30 could take other forms such as a threaded orifice in hanger 26. That is, in the shown embodiment threaded rod 28 is rotatable with respect to hanger 26 to raise support 22 and display 500 which it carries (refer to FIGS. 12-15 and the associated discussion). However in another embodiment, threaded rod 28 remains stationary (non-rotatable) with respect to hanger 26 and threaded receptacle 30 is turned to raise support 22 and display 500 (refer to FIGS. 18 and 19 and the associated discussion).

In the shown embodiment, installation tool 20 further includes a first variable length guide 32 which downwardly extends from support 22, and a second variable length guide 34 which downwardly extends from support 22. First 32 and second 34 variable length guides are useful in stabilizing support 22 of installation tool 20, and also aligning installation tool 20 with respect to wall 600 so that threaded rod 28 is approximately parallel to wall 600 (refer to FIG. 9). First 32 and second 34 variable length guides each include a lower portion 33 which freely slide within an upper portion. This is what occasions the variable length feature. During use, gravity cause the lower portions 33 to downwardly extend until they reach support surface 700, thereby increasing the length of the guides. It is important to note that variable length guides 32 and 34 do not serve to support support 22 and display 500, but rather only dangle beneath support 22. It is noted that variable length guides 32 and 34 do not support the weight of display 500. In the shown embodiments variable length guides 32 and 34 are slidably connected to support 22 by bushings 35 which are (1) slidably positionable along the length of variable length guides 32 and 34, and (2) are also slidably positionable within slots 37 to accommodate variations in wall mount 602 configurations. For added stability, in the shown embodiment the tops of first 32 and second 34 variable length guides are also connected to wall mount 602 by connectors 36 which are attached to the top of the guides (refer to FIGS. 8 and 9). In the shown embodiment connectors 36 are bolted to wall mount 602.

Figure 8:
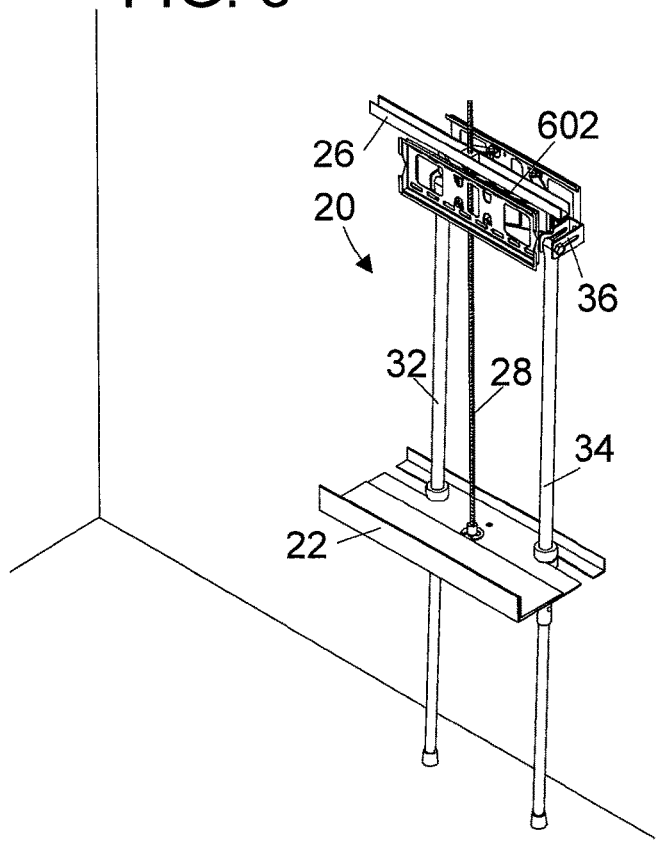
FIG. 8 is a perspective view of the installation tool connected to the wall mount.
Figure 17:
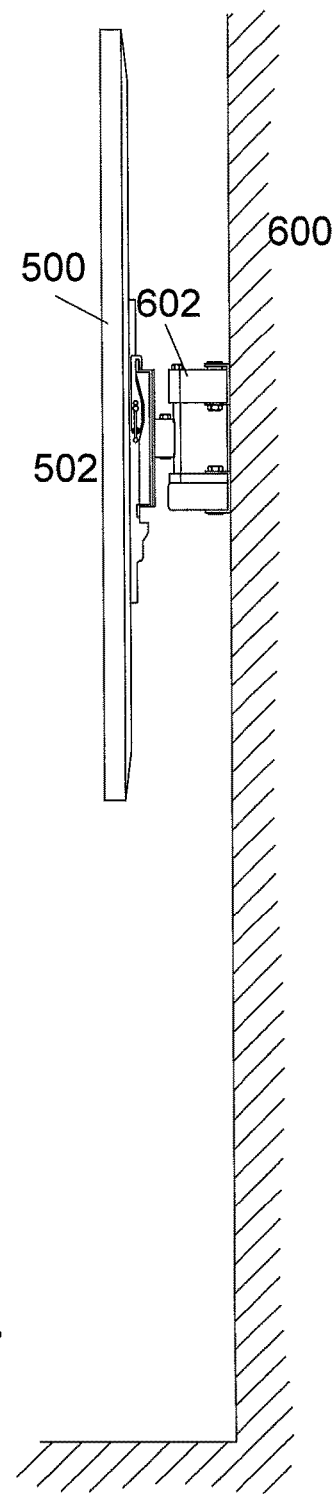
FIG. 17 is an enlarged side elevation view of FIG. 16.

FIG. 17 show the steps of the using installation tool 20 to install display 500 on wall 600. FIG. 8 is a perspective view of installation tool 20 connected to wall mount 602, and FIG. 9 is an enlarged side elevation view of FIG. 8. Wall mount 602 is first connected to wall 600 at the desired location. Hanger 26 engages wall mount 602 and hangs therefrom. Since they are connected to hanger 26, threaded rod 28, support 22, and the top portion of guides 32 and 34 also hang from wall mount 602. The lower portions 33 of guides 32 and 34 rest upon support surface 700. In the shown embodiment, wall mount 602 is articulated, and if pushed toward wall 600 presents an opening which can pass (from bottom to top) hanger 26. Once hanger 26 is through the gap in wall mount 602 is moved away from wall 600 to capture hanger 26.

FIG. 10 is a perspective view of display 500 resting in the support 22 of installation tool 20, and FIG. 11 is an enlarged side elevation view of FIG. 10. Display 500 which has a weight is placed and approximately centered in support 22, wherein installation tool 20 and display 500 are in an in-use configuration with hanger 26 connected to wall mount 600 and display 500 resting in support 22. In this in-use configuration the weight of display 500 is borne by wall mount 502 via hanger 26, threaded rod 28, threaded receptacle 30, and support 22. That is, the weight of the display 500 is borne by wall mount 602 and not by support surface 700. Put another way, installation tool 20 does not rely upon support surface 700 to form a foundation for lifting display 500. The weights of installation tool 20 and display 500 are borne by wall mount 602. In the shown embodiment, display 500 has two display connectors 502 which are positioned on the back of display 500. These display connectors 502 are configured to connect to wall mount 602 to hold display 500 in place upon wall 600. Wall mount 602 and display connectors 502 are shown in broken lines for reference purposes. It is observed that display must be moved up so that display connectors 502 can engage wall mount 602.

FIG. 12 is a perspective view of display 500 being moved upward by installation tool 20, and FIG. 13 is an enlarged side elevation view of FIG. 12. Rotational tool 900 (a drill motor as shown) is used to cause display 500 to be raised. Rotational tool 900 engages rotational head 29 of rod 28 causing rod 28 to rotate in threaded aperture 30 and thereby raise display 500. It is noted that display connectors 502 are now vertically closer to wall mount 602. It is also noted that lower portion 33 of guide 34 (and 32 not shown) are biased by gravity toward support surface 700 (downward arrow).

FIG. 14 is a perspective view of display 500 moved further upward, and FIG. 15 is an enlarged side elevation view of FIG. 14. Using rotational tool 900 (refer to FIG. 13), display 500 has been raised so that display connectors 502 are almost vertically aligned with wall mount 602.

Display 500 has been raised to the point that display connectors 502 can be connected to wall mount 602 so that display now hangs from the wall mount 602. In the shown embodiment display connectors 502 hook over and hang from wall mount 602.

Figure 16:
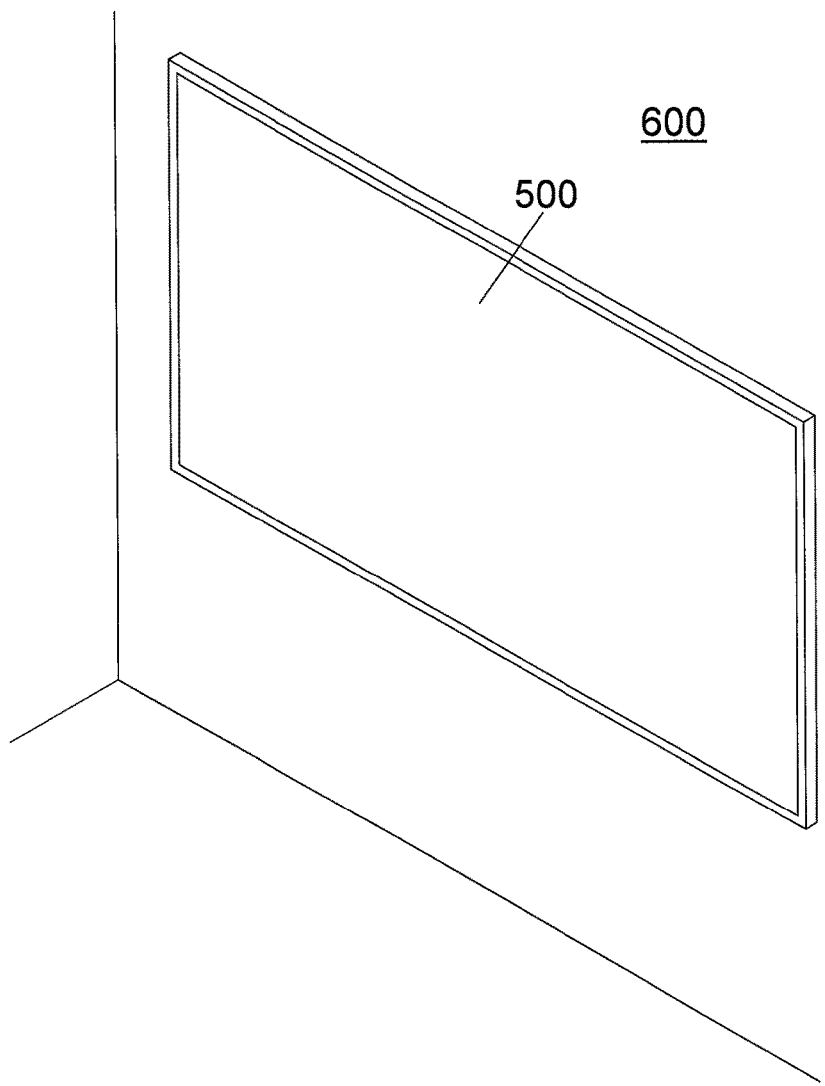
FIG. 16 is a perspective view of the display connected to the wall mount with the installation tool removed.

FIG. 16 is a perspective view of display 500 connected by display connectors 502 from wall mount 602 with installation tool 20 removed, and FIG. 17 is an enlarged side elevation view of FIG. 16. Articulated wall mount 602 has been pushed toward wall BOO so that display 500 is close to wall 600. Display 500 is now ready to be used. In the shown embodiment moving wall mount 602 toward wall 600 facilitates the removal of hanger 26 (refer to FIG. 3).

FIG. 18 is an enlarged side elevation view of a second embodiment of installation tool 20, and FIG. 19 is a side elevation view showing the support 22 raised. In the previously discussed embodiment of FIGS. 17, threaded rod 28 was rotated to raise support 22 and display 500. In this second embodiment threaded rod 28 remains stationary (non-rotational) and threaded receptacle 30 is rotated. Threaded rod is connected to hanger 26 and is non-rotatable with respect to hanger 26. Threaded receptacle 30 receives threaded rod 28, is disposed below support 22, and is rotatable. In FIG. 19, when threaded receptacle 30 is rotated it moves support 22 up toward hanger 26 which is connected to wall mount 602. Also in FIGS. 18 and 19, hanger 26 is a hook which connects to the structure of wall mount 602. Also in this embodiment guide connectors 36 are bolts which connect to wall mount 602. As with the previously discussed embodiment, the lower portions 33 of variable length guide 34 (and 32 not shown) are biased by gravity into contact with support surface 700, but do not support installation tool 20 nor display 500.

It may be appreciated that installation tool 20 may be combined with display 500, wall 600, and wall mount 602 to form an installation system.

In terms of use, a display installation method includes:
(a) providing a display 500 having a weight;
(b) providing a wall 600;
(c) providing a wall mount 602 which is configured to connect the display 500 to the wall 600;
(d) providing an installation tool 20 including:
  a support 22 which is configured to receive the display 500;
  a hanger 26 which is configured to connect to the wall mount 600;
  a threaded rod 28 which connects the support 22 and the hanger 26;
  a threaded receptacle 30 which receives the threaded rod 28;
(e) connecting the wall mount 602 to the wall 600;
(f) connecting the hanger 26 to the wall mount 600;
(g) placing the display 500 in the support 22;
(h) causing the display 500 to move upward to a desired position adjacent to the wall mount 602;
(i) connecting the display 500 to the wall mount 602; and,
(j) disconnecting the hanger 26 from the wall mount 602 and removing the installation tool 20.

The method further including:
in (g), the weight of the display 500 being borne by the wall mount 602 via the hanger 26, the threaded rod 28, the threaded receptacle 30, and the support 22.

The method further including:
in (d), the threaded receptacle 30 connected to the hanger 26, and the threaded rod 28 being rotatable; and,
in (h), rotating the threaded rod 28.

The method further including:
in (d), the threaded 28 rod connected to the hanger 26; and,
in (h), rotating the threaded receptacle 30.

The method further including:
in (d), the support 22 including a pad 24 which is configured to cushion the bottom edge 502 of the display 500; and,
in (g), placing the bottom edge 502 of the display 500 upon the pad 24.

The method further including:
in (d), providing a first variable length guide 32 which downwardly extends from the support 22, and a second variable length guide 34 which downwardly extends from the support 22; and,
during (g), using the first 32 and second 34 variable length guides to position the threaded rod 28 parallel with the wall 700.

Now referring to FIGS. 20 and 21, there are illustrated enlarged front elevation and side elevation views respectively of a third embodiment of installation tool 20. This embodiment incorporates most of the features of the embodiments of FIGS. 1-19 with the exception that in this third embodiment hanger 26 is connected to and hangs from a secondary wall mount 40 which is in addition to wall mount 602. Hanger 26 does not connect to wall mount 602 as in the previous embodiments. In the shown embodiment hanger 26 is a hook which is connected to secondary wall mount 40 which is an L bracket which is connected to wall 600 below wall mount 602. In this embodiment secondary wall mount 40 bears all of the weight of display 500, rather than wall mount 602 doing so. First 32 and second 34 variable length guides can be connected to wall mount 602 (as shown) or to secondary wall mount 40 if desired.

In terms of using the third embodiment, a display installation method includes:
(a) providing a display 500 having a weight;
(b) providing a wall 600;
(c) providing a wall mount 602 which is configured to connect the display 500 to the wall 600;
(d) providing an installation tool 20 including:
  a support 22 which is configured to receive the display 500;
  a secondary wall mount 40 which is configured to connect to the wall 600;
  a hanger 26 which is configured to connect to the secondary wall mount 40;
  a threaded rod 28 which connects the support 22 and the hanger 26;
  a threaded receptacle 30 which receives the threaded rod 28;
(e) connecting the wall mount 602 to the wall 600;
(f) connecting the secondary wall mount 40 to the wall 600;
(g) connecting the hanger 26 to the secondary wall mount 40;
(h) placing the display 500 in the support 22;
(i) causing the display 500 to move upward to a desired position adjacent to the wall mount 602;
(j) connecting the display 500 to the wall mount 602; and,
(k) disconnecting the hanger 26 from the secondary wall mount 40 and removing the installation tool 20.

The embodiments of the installation tool for a display and method of use described herein are exemplary and numerous modifications, combinations, variations, and rearrangements can be readily envisioned to achieve an equivalent result, all of which are intended to be embraced within the scope of the appended claims. Further, nothing in the above-provided discussions of the installation tool and method and method should be construed as limiting the invention to a particular embodiment or combination of embodiments. The scope of the invention is defined by the appended claims.

I claim:

1. A display installation method comprising:
   (a) providing a display having a weight;
   (b) providing a wall;
   (c) providing a wall mount which is configured to connect said display to said wall;
   (d) providing an installation tool including:
     a support which is configured to receive said display;
     a hanger which is configured to connect to said wall mount;
     a threaded rod which connects said support and said hanger;
     a threaded receptacle which receives said threaded rod;
   (e) connecting said wall mount to said wall;
   (f) connecting said hanger to said wall mount;
   (g) placing said display in said support, said weight of said display being borne by said wall mount via said hanger, said threaded rod, said threaded receptacle, and said support;
   (h) causing said display to move upward to a desired position adjacent to said wall mount;
   (i) connecting said display to said wall mount; and,
   (j) disconnecting said hanger from said wall mount.

2. The method of claim 1, further including:
   in (d), said threaded receptacle connected to said hanger, and said threaded rod being rotatable; and,
   in (h), rotating said threaded rod.

3. The method of claim 1, further including:
   in (d), said threaded rod connected to said hanger; and,
   in (h), rotating said threaded receptacle.

4. The method of claim 1, further including:
   in (a), said display having a bottom edge;
   in (d), said support including a pad which is configured to cushion said bottom edge of said display; and,
   in (g), placing said bottom edge of said display upon said pad.

5. The method of claim 1, further including:
   in (d), providing a first variable length guide which downwardly extends from said support, and a second variable length guide which downwardly extends from said support; and,
   during (g), using said first and second variable length guides to position said threaded rod parallel with said wall.

* * * * *